(12) United States Patent
Zhang et al.

(10) Patent No.: US 11,257,785 B2
(45) Date of Patent: Feb. 22, 2022

(54) MULTI-MODULE INTEGRATED INTERPOSER AND SEMICONDUCTOR DEVICE FORMED THEREFROM

(71) Applicant: WESTERN DIGITAL TECHNOLOGIES, INC., San Jose, CA (US)

(72) Inventors: Cong Zhang, Shanghai (CN); Chin-Tien Chiu, Taichung (TW); Xuyi Yang, Shanghai (CN); Yazhou Zhang, Shanghai (CN)

(73) Assignee: Western Digital Technologies, Inc., San Jose, CA (US)

( * ) Notice: Subject to any disclaimer, the term of this patent is extended or adjusted under 35 U.S.C. 154(b) by 28 days.

(21) Appl. No.: 16/818,817

(22) Filed: Mar. 13, 2020

(65) Prior Publication Data
US 2020/0365554 A1 Nov. 19, 2020

(30) Foreign Application Priority Data
May 15, 2019 (CN) .......................... 201910403773.7

(51) Int. Cl.
*H01L 25/065* (2006.01)
*H01L 25/00* (2006.01)

(52) U.S. Cl.
CPC .......... *H01L 25/0652* (2013.01); *H01L 25/50* (2013.01); *H01L 2225/06506* (2013.01); *H01L 2225/06513* (2013.01); *H01L 2225/06541* (2013.01); *H01L 2225/06586* (2013.01)

(58) Field of Classification Search
None
See application file for complete search history.

(56) References Cited

U.S. PATENT DOCUMENTS

| | | | |
|---|---|---|---|
| 8,704,384 B2 * | 4/2014 | Wu | H01L 25/0655 257/782 |
| 9,287,140 B2 | 3/2016 | Chung et al. | |
| 2011/0186992 A1 * | 8/2011 | Wu | H01L 23/13 257/737 |
| 2016/0181211 A1 | 6/2016 | Kamgaing et al. | |
| 2019/0043808 A1 * | 2/2019 | Fontanelli | H01L 24/16 |
| 2020/0258801 A1 * | 8/2020 | Lin | H01L 23/49816 |

* cited by examiner

*Primary Examiner* — Long Pham
(74) *Attorney, Agent, or Firm* — Vierra Magen Marcus LLP (57) ABSTRACT

A semiconductor device is disclosed including a multi-module interposer for enabling communication between one or more semiconductor dies within the device and a host device on which the semiconductor device is mounted. The multi-module interposer may be formed at the wafer level, and provides fan-out signal paths to and from the one or more dies in the device. Additionally, the multi-module interposer allows any of a variety of different semiconductor packaging configurations to be formed at the wafer level, including for example wire bonded packages, flip chip packages and through silicon via (TSV) packages.

11 Claims, 6 Drawing Sheets

MULTI-MODULE INTEGRATED INTERPOSER AND SEMICONDUCTOR DEVICE FORMED THEREFROM

BACKGROUND

The strong growth in demand for portable consumer electronics is driving the need for high-capacity storage devices. Non-volatile semiconductor memory devices, such as flash memory storage cards, are widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs and cellular telephones.

While many varied packaging configurations are known, flash memory semiconductor products may in general be fabricated as system-in-a-package (SIP) or multichip modules (MCM), where a plurality of semiconductor die are mounted and interconnected to an upper surface of substrate. The substrate may in general include a rigid, dielectric base having a conductive layer etched on one or both sides. Solder balls are often mounted on contact pads formed on a lower surface of the substrate to allow the substrate to be soldered to a host device such as a printed circuit board. Once mounted, signals may be transferred between the semiconductor die and the host device via the substrate.

There is an ever-present demand to provide greater storage capacity in a smaller overall form factor semiconductor package. One area of exploration is to provide the semiconductor package without a substrate, but to date, such efforts at providing a multichip semiconductor package with no substrate have proven difficult.

DETAILED DESCRIPTION

The present technology will now be described with reference to the figures, which in embodiments, relate to a semiconductor device including a multi-module interposer for enabling communication between one or more semiconductor dies within the device and a host device on which the semiconductor device is mounted. The multi-module interposer may be formed at the wafer level, and provides fan-out signal paths to and from the one or more dies in the device. Additionally, the multi-module interposer allows any of a variety of different semiconductor packaging configurations to be formed at the wafer level, including for example wire bonded packages, flip chip packages and through silicon via (TSV) packages.

It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

The terms "top" and "bottom," "upper" and "lower" and "vertical" and "horizontal," and forms thereof, as may be used herein are by way of example and illustrative purposes only, and are not meant to limit the description of the technology inasmuch as the referenced item can be exchanged in position and orientation. Also, as used herein, the terms "substantially" and/or "about" mean that the specified dimension or parameter may be varied within an acceptable manufacturing tolerance for a given application. In one embodiment, the acceptable manufacturing tolerance is ±2.5% of a given dimension.

An embodiment of the present technology will now be explained with reference to the flowchart of FIG. 1, and the views of FIGS. 2-12. In steps 200 and 202, a semiconductor wafer 100 may be processed into a number of multi-module interposers 102 as shown in FIG. 2. The semiconductor wafer 100 may start as an ingot of wafer material which may be monocrystalline silicon grown according to either a Czochralski (CZ) or floating zone (FZ) process. However, wafer 100 may be formed of other materials and by other processes in further embodiments.

The semiconductor wafer 100 may be cut from the ingot and polished on both the first major planar surface 104, and second major planar surface 105 (FIG. 6) opposite surface 104, to provide smooth surfaces. The first major surface 104 may undergo various processing steps to divide the wafer 100 into the respective multi-module interposers 102. In particular, in step 200, the multi-module interposers 102 may be processed in embodiments to include internal electrical connections formed in a dielectric substrate including layers 114 and 116 as shown in the cross-sectional edge view of FIG. 6. The number of multi-module interposers 102 shown on wafer 100 in FIG. 2 is for illustrative purposes, and wafer 100 may include more multi-module interposers 102 than are shown in further embodiments.

Figure 6:
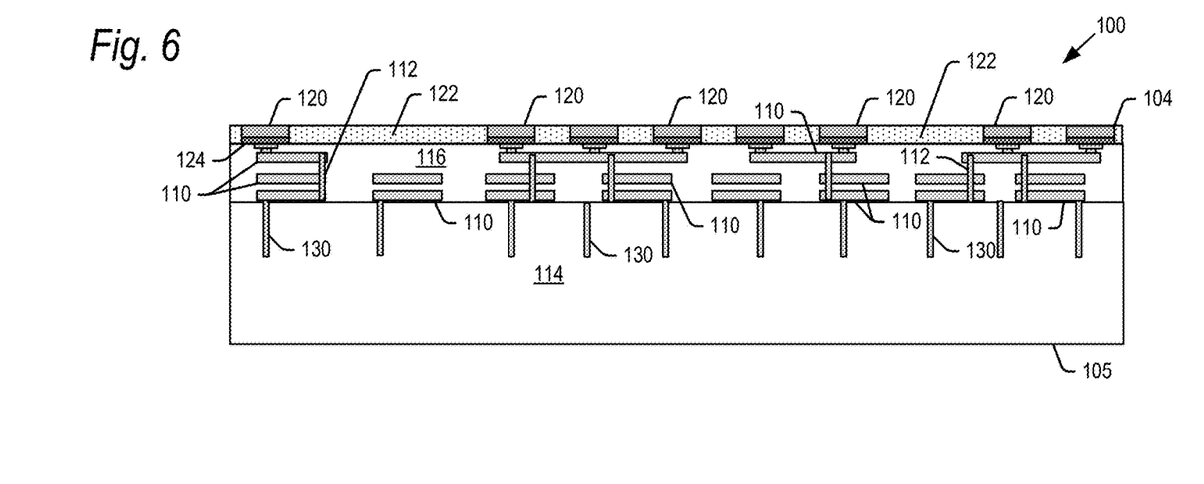
FIG. 6 is a cross-sectional edge view of a wafer including a number of multi-module interposers at a first stage of fabrication according to embodiments of the present technology.

The internal electrical connections within each interposer 102 may include multiple layers of metal interconnects 110 and vias 112 formed sequentially through layers of the dielectric film 116. The metal interconnects 110, vias 112 and dielectric film layers 116 may be formed a layer at a time using photolithographic and thin-film deposition processes. The photolithographic processes may include for example pattern definition, plasma, chemical or dry etching and polishing. The thin-film deposition processes may include for example sputtering and/or chemical vapor deposition. The metal interconnects 110 may be formed of a variety of electrically conductive metals including for example copper and copper alloys as is known in the art, and the vias 112 may be lined and/or filled with a variety of electrically conductive metals including for example tungsten, copper and copper alloys as is known in the art.

Figure 3:
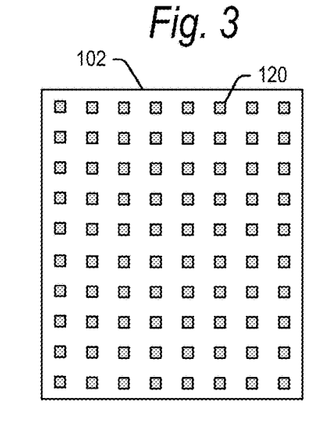
FIG. 3 is a top view of a multi-module interposer including a first configuration of surface bond pads according to embodiments of the present technology.
Figure 4:
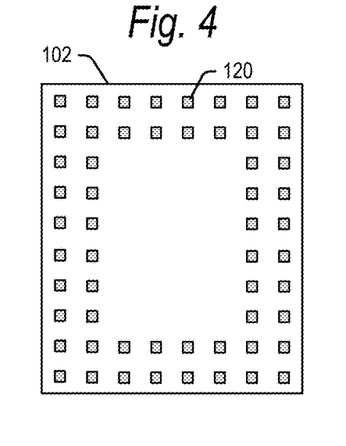
FIG. 4 is a top view of a multi-module interposer including a second configuration of surface bond pads according to embodiments of the present technology.
Figure 5:
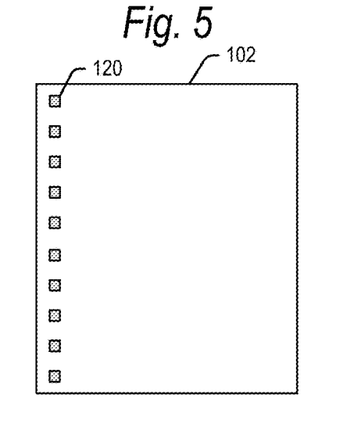
FIG. 5 is a top view of a multi-module interposer including a third configuration of surface bond pads according to embodiments of the present technology.

In step 202, bond pads 120 may be formed on the major planar surface 104 of the multi-module interposers 102. As shown in FIGS. 3, 4 and 5, the bond pads 120 may be formed in a variety of different patterns in the planner surface 104 in different embodiments of the present technology. FIG. 3 shows a uniform pattern of rows and columns of bond pads 120. While the rows and columns are shown as being aligned with each other, it is understood that the rows and/or columns from the offset from each other in further embodiments. FIG. 4 shows a similar configuration of bond pads 120 with a central portion of the interposer 102 being free of bond pads. FIG. 5 shows a configuration with a single column of bond pads. It is understood that the number of bond pads 120, and the patterns of bond pads 120, shown in FIGS. 3-5 is for illustrative purposes, and bond pads 120 may be provided in the major planar surface 104 of the multi-module interposers 102 in other numbers and in a variety of other configurations.

Moreover, it is understood that the various interposers 102 on a single wafer 100 may each have the same pattern of bond pads 120. Alternatively, different interposers 102 on a single wafer 100 may have different patterns of bond pads 120. In such embodiments, a wafer map may be developed defining the different types of semiconductor packages to be formed on the respective interposers 102 (e.g., wire bonded, flip chip, TSV), and the pattern of bond pads 120 on the respective interposers 102 may be customized per this wafer map.

In order to form bond pads 120, a passivation layer 122 (FIG. 6) may be formed on the major planar surface 104. The passivation layer 122 may be etched, and each bond pad 120 may be formed over a liner 124 in the etched regions of the passivation layer. As is known in the art, the bond pads 120 may be formed for example of copper, aluminum and alloys thereof, and the liner 124 may be formed for example of a titanium/titanium nitride stack such as for example Ti/TiN/Ti, though these materials may vary in further embodiments.

The bond pads 120 and liner 124 may be applied by vapor deposition and/or plating techniques. The bond pads and liners together may have a thickness of 720 nm, though this thickness may be larger or smaller in further embodiments. Different sets of bond pads 120 may be electrically connected to each other by the metal interconnects 110 and vias 112.

The internal metal connections further include a series of vias 130 extending down from the bottom most metal interconnects 110 into the dielectric layer 114 of wafer 100. As explained below, the dielectric layer 114 gets thinned in a backgrind process leaving an end of the vias 130 exposed at a back surface (opposite surface 104) of the wafer 100.

Figure 7:
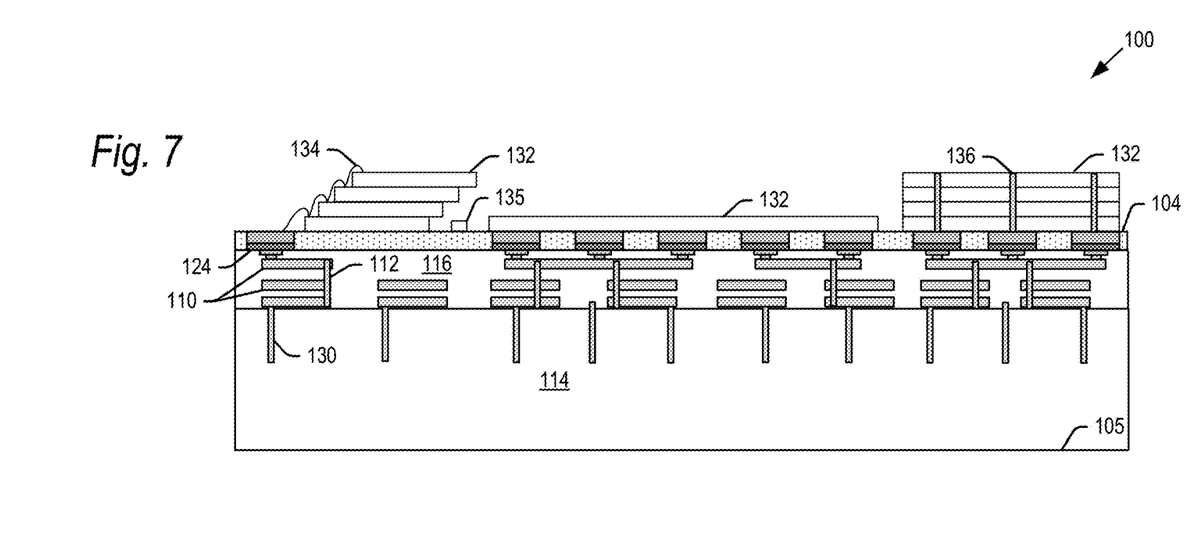
FIG. 7 is a cross-sectional edge view of a wafer including a number of multi-module interposers and semiconductor dies at a second stage of fabrication according to embodiments of the present technology.

In step 208, semiconductor dies 132 may be affixed onto the respective multi-module interposers 102 on wafer 100 as shown in FIG. 7. The dies 132 are mounted on surface 104 of respective interposers 102, as by a die attach film (DAF) on the lower most semiconductor die, and electrically coupled to bond pads 120 of the respective interposers 102. The type of electrical connections depend on the semiconductor package configuration.

For example, FIG. 7 at the left shows a stack of semiconductor dies 132 wire bonded to a row of bond pads 120 (such as the row of bond pads 120 shown in FIG. 5). The wire bonded semiconductor dies 132 may be stacked in an offset stepped configuration to leave a row of bond pads exposed on the die 132 at each level of the stack. Wire bonds 134 may then be formed with a wire bond capillary (not shown) electrically coupling each of the semiconductor dies 132 to each other and to the interposer 102 of wafer 100. The left side of FIG. 7 further shows a passive device 135, such as for example resisters, capacitors and/or inductors, mounted in association with the wire bonded die stack. Any of the package configurations may also include passive devices 135.

The middle portion of FIG. 7 shows a second semiconductor package configuration in the form of a flip chip semiconductor die 132. The flip chip semiconductor die 132 may include a pattern of ball bonds on a lower surface of the semiconductor die 132 (facing the surface 104 of wafer 100) which get bonded to a like a pattern of bond pads 120 on the interposer 102 (such as the pattern of bond pads 120 shown in FIG. 4).

The right-hand side of FIG. 7 shows a third semiconductor package configuration in the form of vertically stacked semiconductor dies electrically coupled to bond pads 120 by through silicon vias 136.

In embodiments, a single wafer 100 may have some or all of the package configurations (wire bonded, flip chip and/or TSV) shown in FIG. 7. As noted above, a wafer map may be prepared showing which types of package configurations are to be formed on which interposers 102 on the wafer 100. As also noted above the pattern of bond pads 120 for a given interposer 102 may be customized for the type of package configuration to be formed on that interposer 102. Alternatively, a single pattern of bond pads 120 may be used on all interposers 102, but only some of those bond pads get used depending on the package configuration.

In a further embodiment, all interposers 102 on a given wafer 100 may receive the same type of package configuration. Thus, all interposers 102 on a wafer 100 may receive a wire bonded semiconductor die package configuration, all interposers 102 on a wafer 100 may receive a flip chip semiconductor die package configuration, or all interposers 102 on a wafer 100 may receive a TSV semiconductor die package configuration. While wire bonded, flip chip and TSV package configurations are shown, it is understood that other types of package configurations may be used instead of or in addition to those shown in FIG. 7.

The semiconductor dies 132 in any configuration may be any of various semiconductor dies including for example memory dies such as 2D NAND flash memory or 3D BiCS (Bit Cost Scaling), V-NAND or other 3D flash memory. However, other types of semiconductor dies may be used, including for example a controller die such as an ASIC, or RAM such as an SDRAM, DDR SDRAM, LPDDR and GDDR. The number of dies 132 in the stacked-die packages may vary from, for example, 2, 4, 8, 16, 32 and 64 dies, though there may be other numbers of dies in further embodiments.

Figure 8:
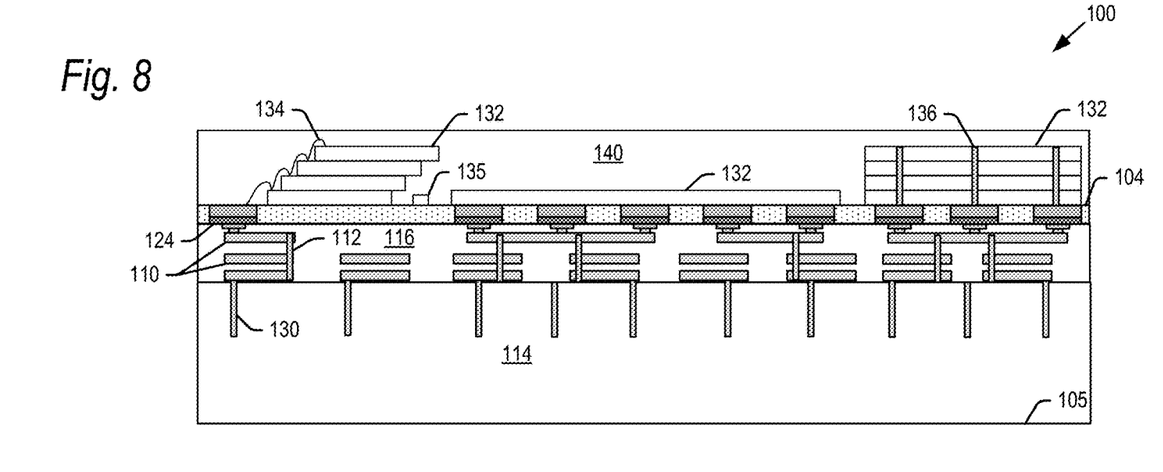
FIG. 8 is a cross-sectional edge view of a wafer including a number of multi-module interposers and encapsulated semiconductor dies at a third stage of fabrication according to embodiments of the present technology.

Referring again to FIG. 1, after the semiconductor dies 132 are mounted to their respective interposers 102, the semiconductor dies 132 may be encapsulated in step 210 in mold compound 140 as shown in FIG. 8. Mold compound 140 may include for example solid epoxy resin, Phenol resin, fused silica, crystalline silica, carbon black and/or metal hydroxide. Other mold compounds from other manufacturers are contemplated. The mold compound may be applied by various known processes, including by compression molding, FFT (flow free thin) molding, transfer molding or injection molding techniques.

Figure 9:
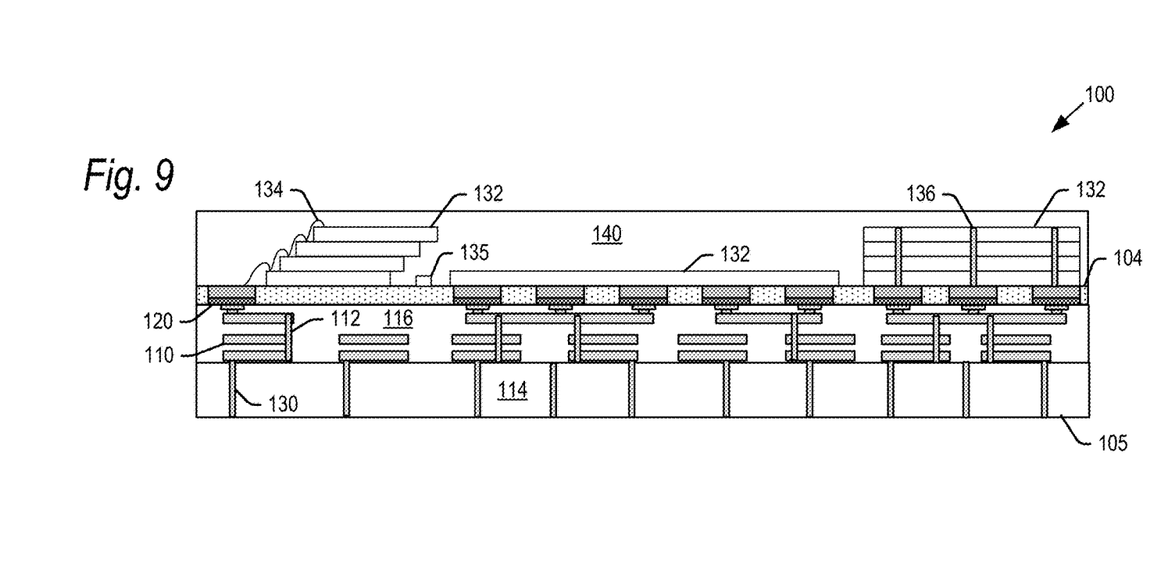
FIG. 9 is a cross-sectional edge view of a thinned wafer including a number of multi-module interposers and encapsulated semiconductor dies at a fourth stage of fabrication according to embodiments of the present technology.

Once the dies 132 are encapsulated, the wafer 100 may be thinned in a backgrind process step 214 as shown in FIG. 9. Backgrind step 214 may accomplish two objectives. First, the backgrind step thins the dielectric layer 114 of the wafer 100 to provide a final wafer thickness. In one example, the backgrind step may thin the wafer from about 760 μm to 30 μm, though these thicknesses may vary in further embodiments. Second, the backgrind step may expose the vias 130 at a bottom surface 105 of the wafer 100 as shown in FIG. 9.

Figure 10:
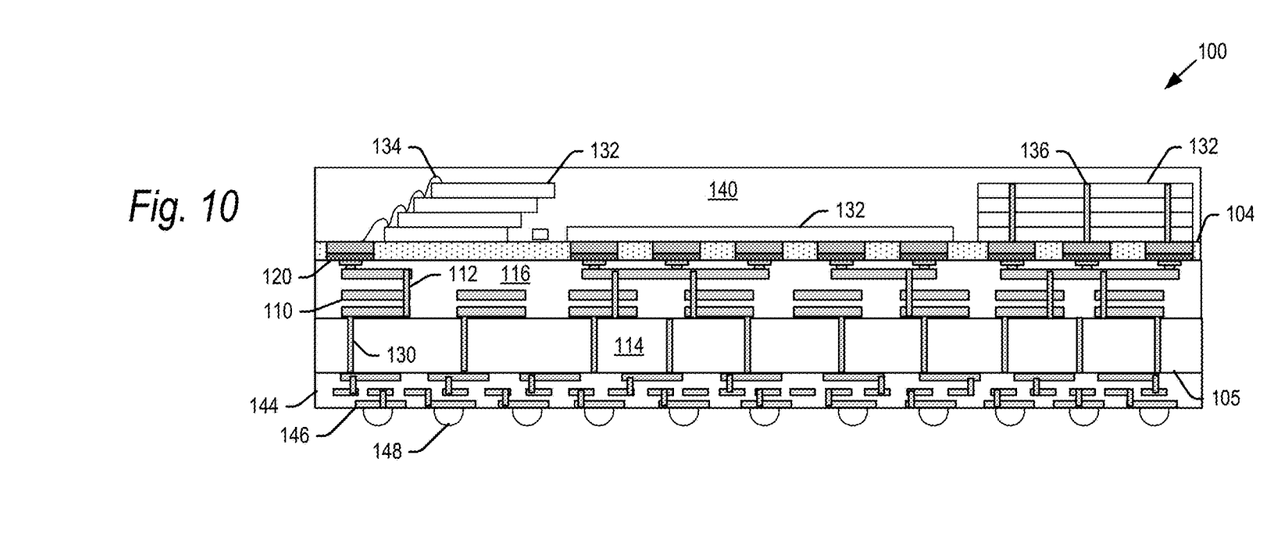
FIG. 10 is a cross-sectional edge view of a thinned wafer including a number of multi-module interposers, encapsulated semiconductor dies and a redistribution layer at a fifth stage of fabrication according to embodiments of the present technology.

In step 216, a redistribution layer (RDL) 144 may be formed on surface 105 of wafer 100 as shown in FIG. 10. The RDL 144 may electrically redistribute the patterns of vias 130 to a pattern of contact pads 146 on a bottom surface of the RDL 144. Solder balls 148 may be mounted on the contact pads 146 in a step 220. Thus, in accordance with aspects of the present technology, using the multi-module interposer 102, select ones of bond pads 120 are electrically coupled to select ones of solder balls 148.

Figure 11:
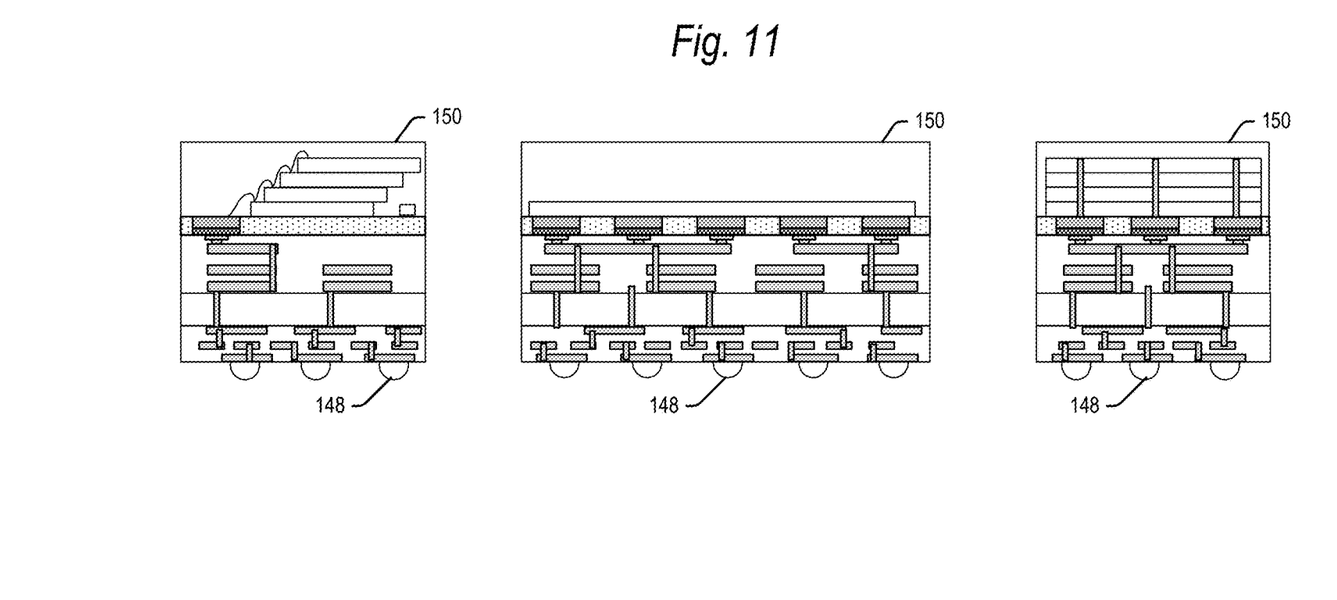
FIG. 11 is a cross-sectional edge view of a number of completed semiconductor devices including multi-module interposers according to embodiments of the present technology.
Figure 12:
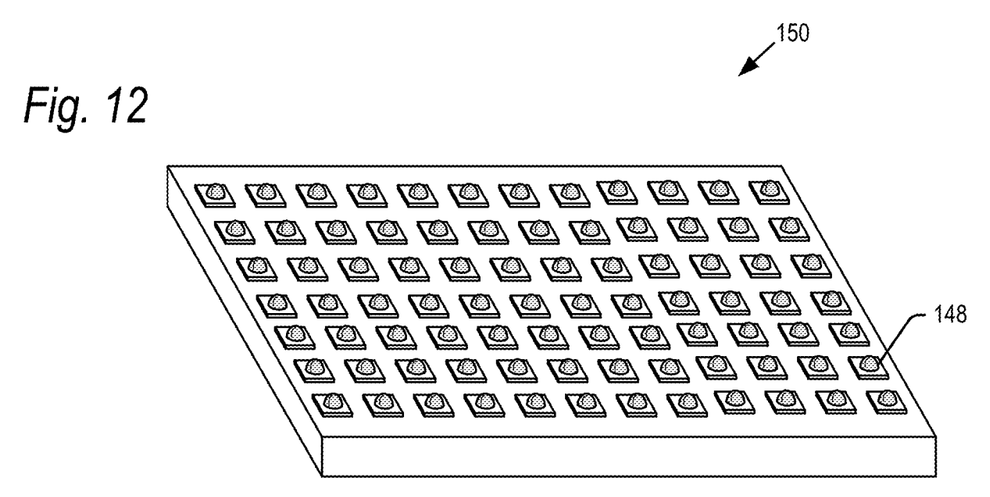
FIG. 12 is a bottom perspective view of a semiconductor device including a multi-module interposer according to embodiments of the present technology.

In step 224, the wafer 100 may be diced to separate the respective multi-module interposers 102, and the semiconductor dies mounted thereon, into separate semiconductor devices 150 as shown in FIG. 11. The devices 150 may be diced by various methods including by saw blade, laser and waterjet cutting methods. FIG. 12 is a bottom perspective view showing a semiconductor device 150 including a pattern of solder balls 148. The particular pattern of solder balls 148 shown is by way of example, and the pattern and number of solder balls may vary in further embodiments. The semiconductor device 150 may then be mounted on a host device (not shown) by soldering the solder balls 148 on to contact pads of the host device. Thereafter, communication between the semiconductor device 150 and the host device may be accomplished through the multi-module interposer 102.

Figure 1:
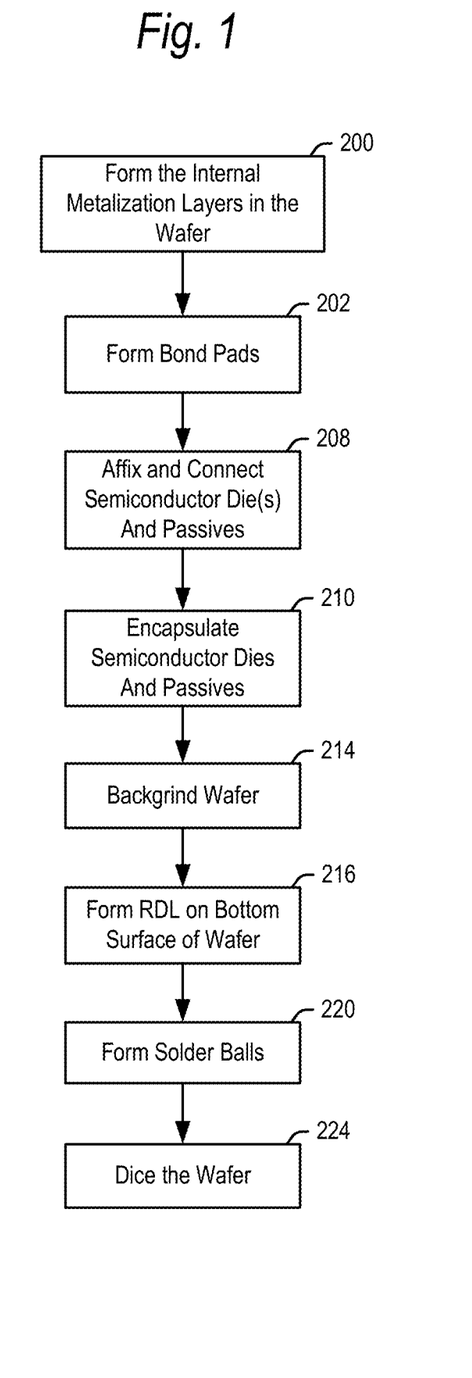
FIG. 1 is a flowchart for forming a semiconductor device according to embodiments of the present technology.
Figure 2:
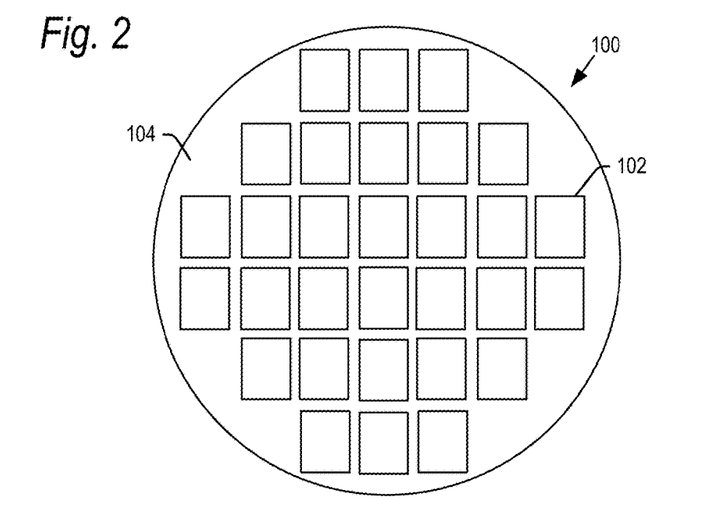
FIG. 2 is a top view of a semiconductor wafer including multi-module interposers according to embodiments of the present technology.

It is understood that the processing steps described with respect to the flowchart of FIG. 1 may be formed in different orders in further embodiments. In one such example, the wafer 100 may be thinned (step 214), the RDL 144 affixed to the wafer (step 216) and the solder balls 148 may be attached to the RDL 144, all prior to the step 208 of connecting the semiconductor dies and passive components. One advantage to this ordering of steps is that a fully fabricated wafer 100 may be shipped to a semiconductor package fabrication plant. At the package fabrication plant, all that is required is the affixing of the semiconductor dies and passive components (step 208), encapsulating the dies and passive components (step 210), and dicing the wafer (step 224) to form a completed semiconductor device 150. This greatly simplifies the processing steps needed at the semiconductor package fabrication plant in comparison to conventional fabrication steps at the semiconductor package fabrication plant.

In embodiments, the multi-module interposer 102 provides an efficient wafer level solution for providing a communication path between semiconductor dies within a semiconductor device and a host device on which the device may be mounted. The interposer 102 further provides a high degree of flexibility in that any of various semiconductor package configurations may be electrically coupled to the interposer 102 at the wafer level. Moreover, the interposer 102 provides a fan-out signal path so that the electrical connections (e.g. solder balls 148) are not constrained to be within the size of the semiconductor dies used within the semiconductor devices 150.

Furthermore, as compared to conventional substrate, the multi-module interposer 102 may be made very thin so as to take up very little height in the overall semiconductor device 150. As noted above, in embodiments the final thickness of the wafer 100 may for example be 30 μm and the RDL may have a thickness of approximately 20 μm to provide a final thickness of interposer 102 of about 50 μm. It is understood that the thicknesses of interposer 102 may be more or less than that in further embodiments.

In summary, an example of the present technology relates to a semiconductor wafer, comprising: a plurality of multi-module interposers, the plurality of multi-module interposers each comprising: a plurality of bond pads on a first surface of each multi-module interposer, a redistribution layer comprising a plurality of contact pads on a second surface of each multi-module interposer opposite the first surface, the plurality of contact pads on the second surface electrically coupled to select ones of the plurality of bond pads on the first surface; and a plurality of semiconductor dies mounted on and electrically coupled to the plurality of multi-module interposers, different multi-module interposers of the plurality of multi-module interposers receiving different configurations of the plurality of semiconductor dies.

In another example, the present technology relates to a semiconductor wafer, comprising: a plurality of multi-module interposers, each multi-module interposer of the plurality of multi-module interposers comprising: a plurality of bond pads on a first surface of the multi-module interposer, at least one dielectric layer, a redistribution layer formed on the dielectric layer, the redistribution layer comprising a plurality of contact pads on a second surface of the multi-module interposer opposite the first surface, and electrical interconnects and vias formed in the at least one dielectric layer for electrically interconnecting the plurality of die bond pads with the plurality of contact pads; and a plurality of semiconductor dies mounted to the plurality of multi-module interposers, one or more of the plurality of semiconductor dies electrically coupled to the plurality of bond pads on the multi-module interposer.

In a further example, the present technology relates to a plurality of semiconductor devices, each comprising: a multi-module interposer, comprising: a plurality of bond pads on a first surface of the multi-module interposer, a redistribution layer comprising a plurality of contact pads on a second surface of the multi-module interposer opposite the first surface, the plurality of contact pads on the second surface electrically coupled to select ones of the plurality of bond pads on the first surface; and one or more dies mounted on the multi-module interposer and electrically coupled to the plurality of bond pads; wherein the plurality of semiconductor devices are configured to receive different configurations of the one or more semiconductor dies.

In another example, the present technology relates to a method of fabricating a semiconductor wafer comprising: (a) forming a plurality of bond pads on a first surface of the semiconductor wafer; (b) forming a plurality of vias, electrically coupled to the plurality of bond pads, extending away from the first surface of the semiconductor wafer toward a second surface of the semiconductor wafer opposite the first surface; (c) thinning the wafer at the second surface so that the plurality of vias are exposed at the second surface; and (d) affixing a redistribution layer to the second surface of the wafer the redistribution layer electrically redistributing locations of the plurality of vias at a first surface of the redistribution layer to a plurality of contact pads at a second surface of the redistribution layer opposite the first surface.

In a further example, the present technology relates to a semiconductor wafer, comprising: interposer means for transferring electrical signals, comprising: bond pad means on a first surface of the interposer means for being electrically coupled to a semiconductor die, redistribution means comprising contact pad means, the redistribution means provided for redistributing locations of the bond pad means to different locations of the contact pad means; and a plurality of semiconductor dies mounted on and electrically coupled to the interposer means, different interposer means receiving different configurations of the plurality of semiconductor dies.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A semiconductor wafer, comprising:
a plurality of multi-module interposers, the plurality of multi-module interposers each comprising:
a plurality of bond pads on a first surface of each multi-module interposer,
a redistribution layer comprising a plurality of contact pads on a second surface of each multi-module interposer opposite the first surface, the plurality of contact pads on the second surface electrically coupled to select ones of the plurality of bond pads on the first surface; and
a plurality of semiconductor dies mounted on and electrically coupled to the plurality of multi-module interposers, different multi-module interposers of the plurality of multi-module interposers having different configurations of bond pads, of the plurality of bond pads, for receiving different configurations of the plurality of semiconductor dies.

2. The semiconductor wafer of claim 1, wherein the different configurations of the plurality of semiconductor dies comprise at least two of: i) a group of wire bonded semiconductor dies, ii) a flip chip semiconductor die and iii) a group of semiconductor dies electrically connected to each other by through silicon vias.

3. The semiconductor wafer of claim 1, wherein the different configurations of bond pads comprise a first pattern of bond pads on the first surface of a first multi-module interposer of the plurality of multi-module interposers, a second pattern of bond pads, different than the first pattern of bond pads, on the first surface of a second multi-module interposer of the plurality of multi-module interposers, and a third pattern of bond pads, different than the first and second patterns of bond pads, on the first surface of a third multi-module interposer of the plurality of multi-module interposers.

4. The semiconductor wafer of claim 3, wherein the first pattern of bond pads is configured to receive a first configuration of the plurality of semiconductor dies, the second pattern of bond pads is configured to receive a second configuration of the plurality of semiconductor dies different than the first configuration, and the third pattern of bond pads is configured to receive a third configuration of the plurality of semiconductor dies different than the first and second configurations.

5. The semiconductor wafer of claim 1, wherein the each of the multi-module interposers comprises a fan-out signal path wherein an area of the second surface of each multi-module interposer having the plurality of contact pads is larger than an area of the first surface of each multi-module interposer having the plurality of bond pads.

6. The semiconductor wafer of claim 1, further comprising a plurality of solder balls affixed to the plurality of contact pads on the second surface of each of the plurality of multi-module interposers.

7. A plurality of semiconductor devices, each from the same semiconductor wafer and comprising:
a multi-module interposer, comprising:
a plurality of bond pads on a first surface of the multi-module interposer,
a redistribution layer comprising a plurality of contact pads on a second surface of the multi-module interposer opposite the first surface, the plurality of contact pads on the second surface electrically coupled to select ones of the plurality of bond pads on the first surface; and
one or more dies mounted on the multi-module interposer and electrically coupled to the plurality of bond pads;
wherein the plurality of semiconductor devices from the same wafer include different patterns of bond pads of the plurality of bond pads, wherein the different patterns of bond pads are configured to receive different configurations of the one or more semiconductor dies.

8. The plurality of semiconductor devices recited in claim 7, wherein the different configurations of the one or more semiconductor dies comprise at least two of: i) a group of wire bonded semiconductor dies, ii) a flip chip semiconductor die and iii) a group of semiconductor dies electrically connected to each other by through silicon vias.

9. The plurality of semiconductor devices recited in claim 7, wherein a first pattern of the different patterns of bond pads is configured to receive one or more wire bonded semiconductor dies.

10. The plurality of semiconductor devices recited in claim 7, wherein a second pattern of the different patterns of bond pads is configured to receive a flip-chip bonded semiconductor die.

11. The plurality of semiconductor devices recited in claim 7, wherein a third pattern of the different patterns of bond pads is configured to receive a group of semiconductor dies electrically connected to each other by through silicon vias.

\* \* \* \* \*